(12) United States Patent
Kanaya et al.

(10) Patent No.: US 12,142,600 B2
(45) Date of Patent: Nov. 12, 2024

(54) DISPLAY PANEL, METHOD OF MANUFACTURING THE DISPLAY PANEL, AND SUBSTRATE

(71) Applicant: Japan Display Inc., Tokyo (JP)

(72) Inventors: Yasuhiro Kanaya, Tokyo (JP); Masanobu Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 627 days.

(21) Appl. No.: 17/330,622

(22) Filed: May 26, 2021

(65) Prior Publication Data

US 2021/0296293 A1 Sep. 23, 2021

Related U.S. Application Data

(63) Continuation of application No. PCT/JP2019/044441, filed on Nov. 12, 2019.

(30) Foreign Application Priority Data

Nov. 27, 2018 (JP) ................................. 2018-221075

(51) Int. Cl.
*H01L 27/12* (2006.01)
*H01L 25/075* (2006.01)

(52) U.S. Cl.
CPC ........ *H01L 25/0753* (2013.01); *H01L 27/124* (2013.01); *H01L 27/1259* (2013.01)

(58) Field of Classification Search
CPC .. H10K 59/124; H10K 59/125; H10K 59/126; H10K 59/127; H10K 50/11; H10K 50/13; H10K 50/131; H10K 50/15; H10K 50/16; H10K 50/165; H10K 50/167; H10K 50/17; H10K 50/171; H10K 50/81; H01L 25/0753; H01L 27/124; H01L 27/1259; H01L 25/167; H01L 33/62; H01L 51/5296; H01L 29/4908; H01L 29/66742–6678; H01L 29/786–78696; H01L 27/12–13; H01L 2924/13069; H01L 29/04–045; H01L 29/16–1608; H01L 29/18–185; H01L 29/22–2206; H01L 27/1214–1296; H01L 29/36–365; H01L 29/41733; H01L 29/783; H01L 29/7831; H01L 27/3274; H01L 29/0847; H01L 27/3202;

(Continued)

(56) References Cited

U.S. PATENT DOCUMENTS

2018/0069126 A1 3/2018 Sasaki et al.
2020/0083311 A1* 3/2020 Cha ..................... H10K 59/126

FOREIGN PATENT DOCUMENTS

| JP | 2018-010309 A | 1/2018 |
| JP | 2018-041752 A | 3/2018 |
| WO | WO 2014/149864 A1 | 9/2014 |

* cited by examiner

*Primary Examiner* — Moin M Rahman
(74) *Attorney, Agent, or Firm* — Maier & Maier, PLLC

(57) ABSTRACT

According to one embodiment, a display panel includes a substrate, a first insulating layer, a second insulating layer, and pixels including subpixels of colors. Each of the subpixels includes a drive transistor, a conductive layer, a pixel electrode receiving a signal having a controlled current value from the drive transistor via the conductive layer, and a light-emitting element. Each of the pixels has a mounting electrode overlaid on the conductive layer in each of the subpixels. In a first pixel of the pixels, the mounting electrode is in an electrically floating state.

7 Claims, 9 Drawing Sheets

(58) Field of Classification Search
CPC ............. H01L 27/3204; H01L 27/3209; H01L 27/3225; H01L 27/3251; H01L 27/3258; H01L 27/3262; H01L 27/3267; H01L 51/50; H01L 2227/32; H01L 2924/12044; H01L 27/32; G09F 9/30; G09F 9/00; G09F 9/33
See application file for complete search history.

DISPLAY PANEL, METHOD OF MANUFACTURING THE DISPLAY PANEL, AND SUBSTRATE

CROSS-REFERENCE TO RELATED APPLICATIONS

This application is a Continuation Application of PCT Application No. PCT/JP2019/044441, filed Nov. 12, 2019 and based upon and claiming the benefit of priority from Japanese Patent Application No. 2018-221075, filed Nov. 27, 2018, the entire contents of all of which are incorporated herein by reference.

FIELD

Embodiments described herein relate generally to a display panel, a method of manufacturing the display panel, and a substrate.

BACKGROUND

A light-emitting diode (LED) display panel using LEDs which are self-luminous elements is known as a display panel. Recently, a display panel in which minute light-emitting diodes referred to as micro-LEDs are mounted on an array substrate (hereinafter referred to as a micro-LED display panel) has been developed as a higher definition display panel.

Since the micro-LED display is formed such that a large number of chip-like micro-LEDs are mounted in a display area, unlike the conventional liquid crystal display or organic EL display, it can easily achieve both higher definition and larger scale, and it is attracting attention as a next-generation display device.

DETAILED DESCRIPTION

Figure 1:
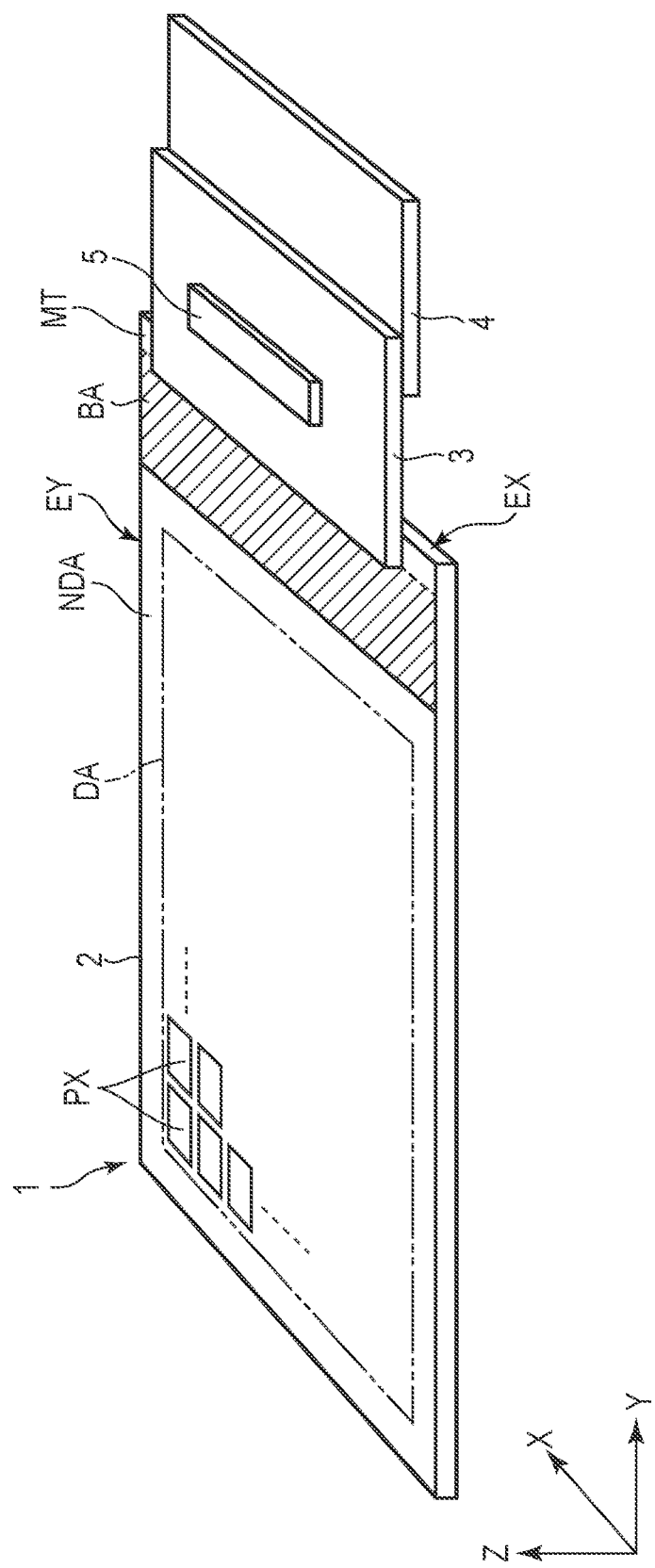
FIG. 1 is a perspective view showing the configuration of a display device according to one embodiment.

In general, according to one embodiment, there is provided a display panel comprising: a substrate; a first insulating layer disposed on the substrate; a second insulating layer disposed on the first insulating layer; and a plurality of pixels disposed on the substrate, located in a display area, and each including subpixels of a plurality of colors. Each of the subpixels includes: a drive transistor covered with the first insulating layer; a conductive layer disposed on the first insulating layer, and electrically connected to the drive transistor; a pixel electrode disposed on the second insulating layer, electrically connected to the conductive layer, and receiving a signal having a controlled current value from the drive transistor via the conductive layer; and a light-emitting element mounted on the pixel electrode, and including a first electrode electrically connected to the pixel electrode. Each of the pixels has a mounting electrode disposed on the second insulating layer, located spaced apart from the pixel electrode, and overlaid on the conductive layer in each of the subpixels. The mounting electrode is in an electrically floating state in a first pixel of the pixels.

According to another embodiment, there is provided a method of manufacturing a display panel, comprising: preparing a panel; the panel comprising: a substrate; a first insulating layer disposed on the substrate; a second insulating layer disposed on the first insulating layer; and a plurality of pixels disposed on the substrate, located in a display area, and including subpixels of a plurality of colors, each of the subpixels having: a drive transistor covered with the first insulating layer; a conductive layer disposed on the first insulating layer, and electrically connected to the drive transistor; a pixel electrode disposed on the second insulating layer, electrically connected to the conductive layer, and receiving a signal having a controlled current value from the drive transistor via the conductive layer; and a light-emitting element disposed on the pixel electrode, and including a first electrode electrically connected to the pixel electrode, each of the pixels having a mounting electrode disposed on the second insulating layer, located spaced apart from the pixel electrode, and overlaid on the conductive layer in each of the subpixels; and inspecting whether the light-emitting elements are defective in light emission or not after preparing the panel. The method further comprises, if the light-emitting elements in a first pixel of the pixels are not defective in light emission, maintaining the mounting electrode in the first pixel in an electrically floating state. The method further comprises, if the light-emitting element of a first color in the subpixel of the first color in a second pixel of the pixels is defective in light emission, radiating laser light to the light-emitting element of the first color in the second pixel, mounting an additional light-emitting element of the first color on the mounting electrode in the second pixel, and electrically connecting a first electrode of the additional light-emitting element to the mounting electrode, and in the second pixel, radiating laser light to a region of the mounting electrode on which the conductive layer in the subpixel of the first color is overlaid, short-circuiting the mounting electrode to the conductive layer in the subpixel of the first color, and electrically connecting the mounting electrode to the drive transistor in the subpixel of the first color.

According to yet another embodiment, there is provided a substrate comprising: in one pixel, a first color micro-light-emitting diode; a second color micro-light-emitting diode; a third color micro-light-emitting diode; and a first electrode on which the first color micro-light-emitting diode is mounted; a second electrode on which the second color micro-light-emitting diode is mounted; a third electrode on which the third color micro-light-emitting diode is mounted; a fourth electrode; a first inorganic insulating film; a first wiring line connected to the first electrode; a second wiring line connected to the second electrode; and a third wiring line connected to the third electrode. The first color micro-light-emitting diode, the second color micro-light-emitting diode and the third color micro-light-emitting diode correspond to different colors. The fourth electrode is in an electrically floating state. A first surface of the first inorganic insulating film is in contact with the first electrode, the second electrode, the third electrode and the fourth electrode. A second surface opposed to the first surface of the first inorganic insulating film is in contact with the first wiring line, the second wiring line and the third wiring line. The first wiring line, the second wiring line and the third wiring line are drawn toward the fourth electrode. A tip of the first wiring line, a tip of the second wiring line and a tip of the third wiring line extending toward the fourth electrode overlap the fourth electrode, respectively. The fourth electrode is insulated from each of the first wiring line, the second wiring line and the third wiring line by the first inorganic insulating film.

One Embodiment

One embodiment of the present invention will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same constituent elements as those described in connection with preceding drawings are denoted by the same reference numbers, and detailed descriptions thereof are omitted unless necessary.

FIG. 1 is a perspective view showing the configuration of the display device 1 according to the present embodiment. FIG. 1 illustrates a three-dimensional space which is defined by a first direction X, a second direction Y perpendicular to the first direction X, and a third direction Z perpendicular to the first direction X and the second direction Y. The first direction X and the second direction Y are orthogonal to each other, but may intersect at an angle other than 90 degrees. In addition, in the present embodiment, the third direction Z is defined as above, and the opposite direction to the third direction z is defined below. When described as the second member above the first member and the second member below the first member, the second member may be in contact with the first member or may be apart from the first member.

A case where the display device 1 is a micro-light-emitting diode (hereinafter referred to as a micro-LED) display device using micro-LEDs which are self-luminous elements will be mainly described in the present embodiment.

As shown in FIG. 1, the display device 1 comprises a display panel 2, a first circuit substrate 3, a second circuit substrate 4 and the like. In some cases, the display panel 2 may be referred to as a substrate.

In one example, the display panel 2 has a rectangular shape. In the illustrated example, a short side EX of the display panel 2 is parallel to the first direction X, and a long side EY of the display panel 2 is parallel to the second direction Y. The third direction Z corresponds to the thickness direction of the display panel 2. The main surface of the display panel 2 is parallel to an X-Y plane defined by the first direction X and the second direction Y. The display panel 2 has a display area DA and a non-display area NDA other than the display area DA. The non-display area NDA has a terminal area MT. In the illustrated example, the non-display area NDA surrounds the display area DA.

The display area DA is an area in which an image is displayed, and comprises a plurality of pixels PX arranged in a matrix, for example.

The terminal area MT is disposed along the short side EX of the display panel 2, and includes a terminal for electrically connecting the display panel 2 to an external device or the like.

The first circuit substrate 3 is mounted on the terminal area MT, and is electrically connected to the display panel 2. The first circuit substrate 3 is, for example, a flexible printed circuit. The first circuit substrate 3 comprises a driver IC chip (hereinafter referred to as a panel driver) 5 which drives the display panel 2, and the like. In the illustrated example, the panel driver 5 is mounted on the first circuit substrate 3. However, the panel driver 5 may be mounted under the first circuit substrate 3. Alternatively, the panel driver 5 may be mounted on a part other than the first circuit substrate 3, and may be mounted on the second circuit substrate 4, for example. The second circuit substrate 4 is, for example, a flexible printed circuit. The second circuit substrate 4 is connected to the first circuit substrate 3, for example, below the first circuit substrate 3.

The panel driver 5 described above is connected to a control board (not shown) via the second circuit substrate 4, for example. The panel driver 5 executes control for displaying an image on the display panel 2 by driving the pixels PX based on an image signal output from the control board, for example.

The display panel 2 may have a bending area BA shown shaded with diagonal lines. The bending area BA is a region to be bent when the display device 1 is accommodated in a housing such as an electronic apparatus. The bending area BA is located on the terminal area MT side of the non-display area NDA. In a state where the bending area BA is bent, the first circuit substrate 3 and the second circuit substrate 4 are disposed below the display panel 2 so as to be opposed to the display panel 2.

Figure 2:
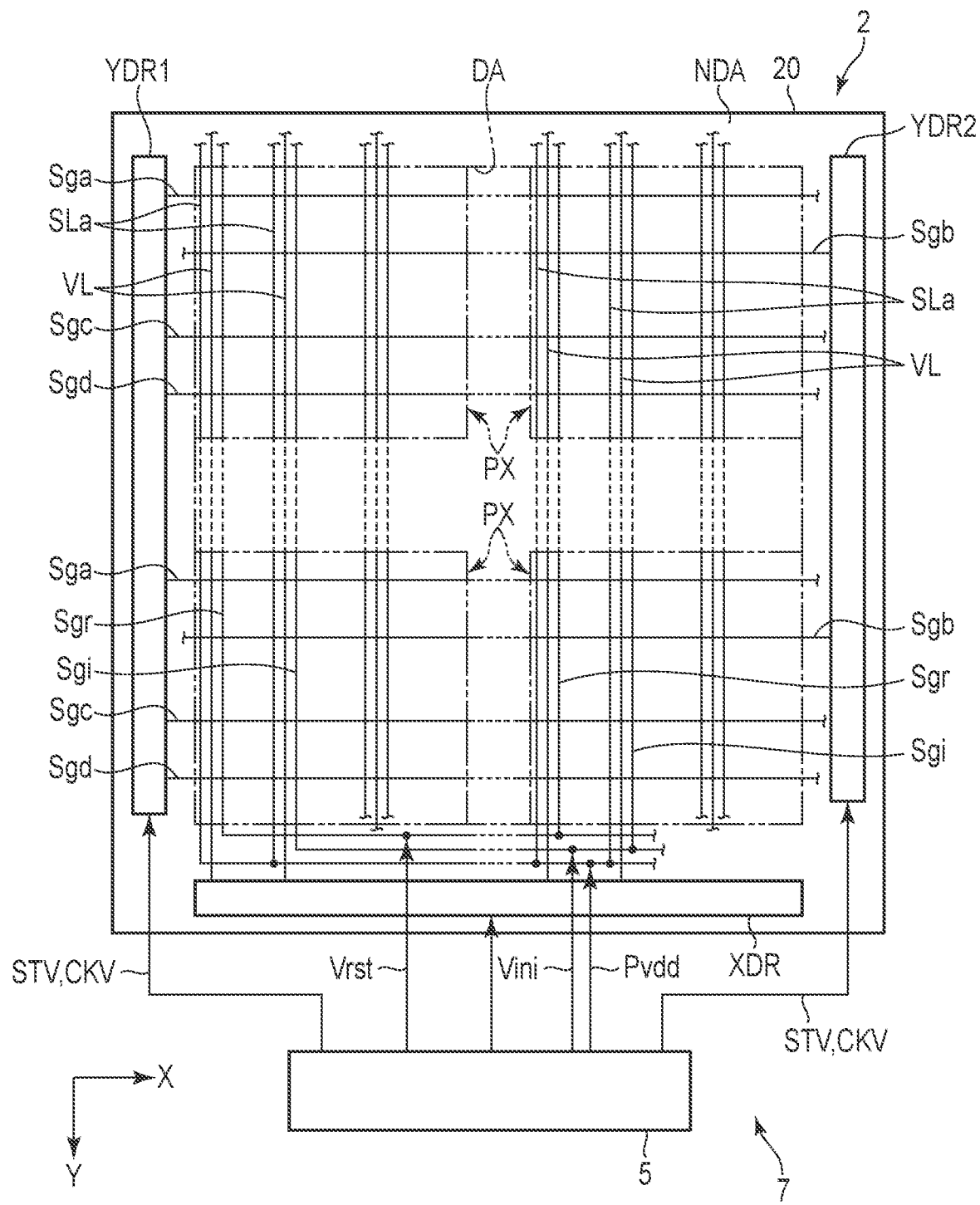
FIG. 2 is a circuit diagram showing the display device.
Figure 3:
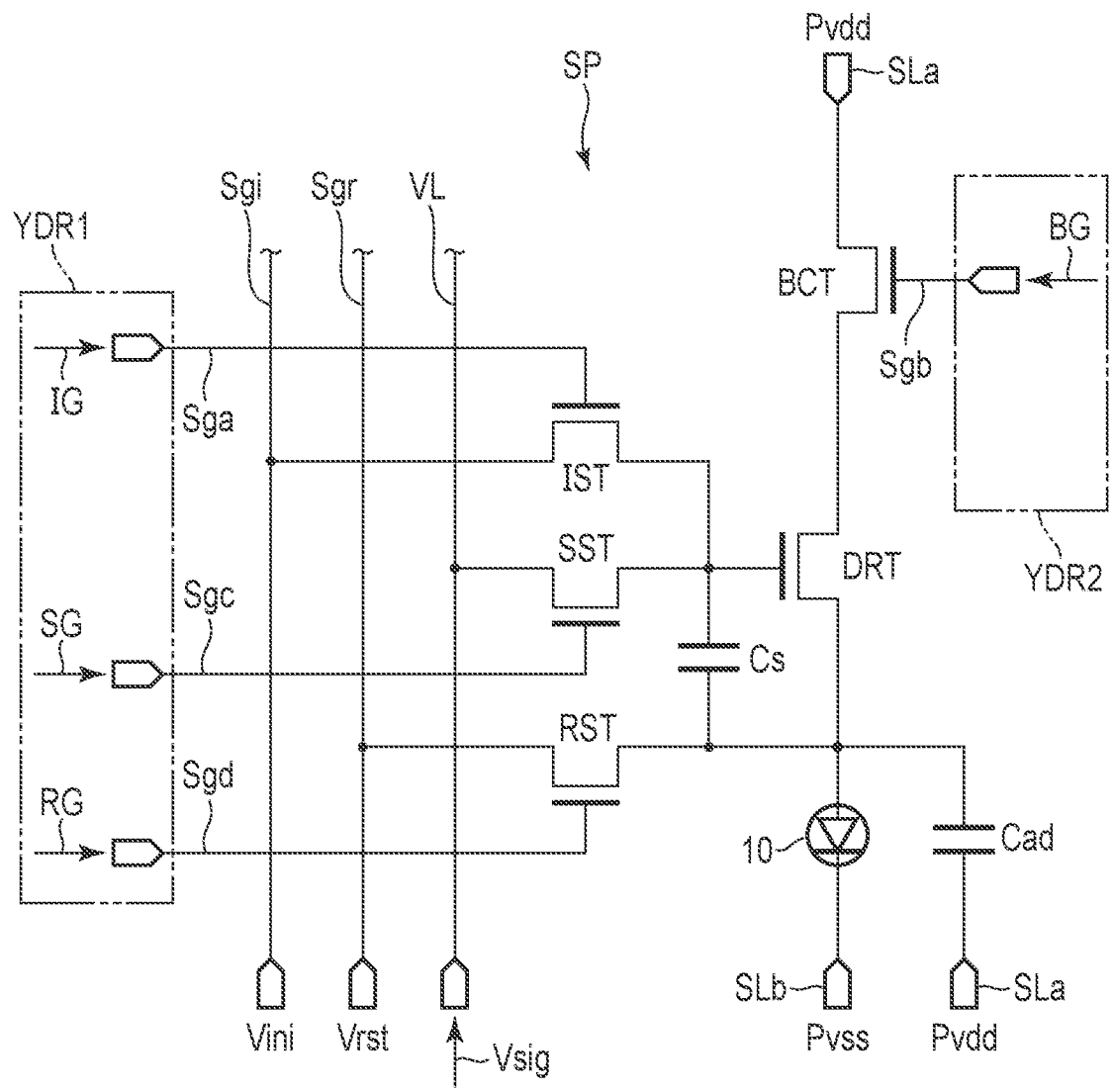
FIG. 3 is an equivalent circuit diagram showing a subpixel of the embodiment.

FIG. 2 is a circuit diagram showing the display device 1. FIG. 3 is an equivalent circuit diagram showing a subpixel SP of the present embodiment. Not all wiring lines are illustrated in FIG. 2.

As shown in FIGS. 2 and 3, the display panel 2 comprises an insulating substrate (substrate) 20 having optical transparency such as a resin substrate or a glass substrate, the pixels PX arranged in a matrix on the insulating substrate 20 in the display area DA, respective wiring lines, scanning line driving circuits YDR1 and YDR2, and a signal line driving circuit XDR.

The respective wiring lines have a plurality of first scanning lines Sga, a plurality of second scanning lines Sgb, a plurality of third scanning lines Sgc, a plurality of fourth scanning lines Sgd, a plurality of image signal lines VL, a plurality of high-potential power supply lines SLa, a plurality of reset lines Sgr, and a plurality of initialization lines Sgi.

In the present embodiment, the first scanning lines Sga, the third scanning lines Sgc and the fourth scanning lines Sgd are connected to the scanning line driving circuit YDR1, and are disposed extending in the first direction X. The second scanning lines Sgb are connected to the scanning line driving circuit YDR2, and are disposed extending in the first direction X. The image signal lines VL are connected to the signal line driving circuit XDR, and are disposed extending in the second direction Y. The high-potential power supply lines SLa, the reset lines Sgr and the initialization lines Sgi are disposed extending in the second direction Y. The display panel 2 has not only the high-potential power supply lines SLa fixed to a high potential Pvdd but also low-potential power supply lines SLb fixed to a low potential Pvss. The high-potential power supply lines SLa are connected to a high-potential power supply, and the low-potential power supply lines SLb are connected to a low-potential power supply.

The scanning line driving circuit YDR1 is configured to drive the first scanning lines Sga, the third scanning lines Sgc and the fourth scanning lines Sgd. The scanning line driving circuit YDR2 is configured to drive the second scanning lines Sgb. The signal line driving circuit XDR is configured to drive the image signal lines VL. The scanning line driving circuits YDR1 and YDR2 and the signal line driving circuit XDR are formed on the insulating substrate 20 in the non-display area NDA, and constitute a driver 7 with the panel driver 5.

Each pixel PX has a plurality of subpixels SP. Each subpixel SP includes a light-emitting element 10 and a pixel circuit which applies a drive current to the light-emitting element 10. The light-emitting element 10 is, for example, a self-luminous light-emitting element, and is a micro-light-emitting diode (hereinafter referred to as a micro-LED) in the present embodiment. The display device 1 of the present embodiment is a micro-LED display device.

The pixel circuit of each subpixel SP is a voltage signal type pixel circuit in which the light emission of the light-emitting element 10 is controlled according to an image signal Vsig which is a voltage signal, and has a reset switch RST, a pixel switch SST, an initialization switch IST, an output switch BCT, a drive transistor DRT, a storage capacitance Cs and an auxiliary capacitance Cad. The storage capacitance Cs and the auxiliary capacitance Cad each are a capacitor. The auxiliary capacitance Cad is an element disposed for adjusting a light emission current amount, and may be unnecessary in some cases.

The reset switch RST, the pixel switch SST, the initialization switch IST, the output switch BCT and the drive transistor DRT are composed of a thin-film transistor (TFT). In the present embodiment, the reset switch RST, the pixel switch SST, the initialization switch IST, the output switch BCT and the drive transistor DRT are composed of a TFT of the same conductive type, for example, an N-channel type. One or more of the reset switch RST, the pixel switch SST, the initialization switch IST, the output switch BCT and the drive transistor DRT may be composed of a P-channel TFT.

In that case, the N-channel TFT and the P-channel TFT may be formed simultaneously with each other. The reset switch RST, the pixel switch SST, the initialization switch IST and the output switch BCT only have to function as a switch, and do not have to be composed of a TFT.

In the display device 1 according to the present embodiment, the TFTs constituting the drive transistor DRT and the respective switches are all formed in the same process and has the same layer structure, and each are a top-gate thin-film transistor using polycrystalline silicon for a semiconductor layer. The semiconductor layer may use semiconductor other than polycrystalline silicon such as amorphous silicon or oxide semiconductor.

The reset switch RST, the pixel switch SST, the initialization switch IST, the output switch BCT and the drive transistor DRT each have a first terminal, a second terminal and a control terminal. In the present embodiment, the first terminal is a source electrode, the second terminal is a drain electrode, and the control terminal is a gate electrode.

In the pixel circuit of the pixel PX, the drive transistor DRT and the output switch BCT are connected in series to the light-emitting element 10 between the high-potential power supply line SLa and the low-potential power supply line SLb. The high-potential power supply line SLa (the high potential Pvdd) is set to, for example, a potential of 10 V, and the low-potential power supply line SLb (the low potential Pvss) is set to, for example, a potential of 1.5 V.

In the output switch BCT, the drain electrode is connected to the high-potential power supply line SLa, the source electrode is connected to the drain electrode of the drive transistor DRT, and the gate electrode is connected to the second scanning line Sgb. Accordingly, the output switch BCT is on (conductive state)/off (non-conductive state) controlled by a control signal BG applied to the second scanning line Sgb. In response to the control signal BG, the output switch BCT controls the light emission period of the light-emitting element 10.

In the drive transistor DRT, the drain electrode is connected to the source electrode of the output switch BCT, and the source electrode is connected to one electrode (here, the anode) of the light-emitting element 10. The other electrode (here, the cathode) of the light-emitting element 10 is connected to the low-potential power supply line SLb. The drive transistor DRT outputs a drive current having a current amount corresponding to the image signal Vsig to the light-emitting element 10.

In the pixel switch SST, the source electrode is connected to the image signal line VL, the drain electrode is connected to the gate electrode of the drive transistor DRT, and the gate electrode is connected to the third scanning line Sgc functioning as a gate line for signal write control. The pixel switch SST is on/off controlled by a control signal SG supplied from the third scanning line Sgc. Then, in response to the control signal SG, the pixel switch SST controls connection/disconnection between the pixel circuit and the image signal line VL, and takes in the image signal Vsig from the image signal line VL to the pixel circuit.

In the initialization switch IST, the source electrode is connected to the initialization line Sgi, the drain electrode is connected to the gate electrode of the drive transistor DRT, and the gate electrode is connected to the first scanning line Sga. The initialization switch IST is on/off controlled by a control signal IG supplied from the first scanning line Sga. Then, in response to the control signal IG, the initialization switch IST controls connection and disconnection between the pixel circuit and the initialization line Sgi. By connecting the pixel circuit and the initialization line Sgi with the initialization switch IST, it is possible to take in an initialization potential (initialization voltage) Vini from the initialization line Sgi to the pixel circuit.

The reset switch RST is connected between the source electrode of the drive transistor DRT and the reset line Sgr. The gate electrode of the reset switch RST is connected to the fourth scanning line Sgd functioning as a gate line for reset control. As described above, the reset line Sgr is connected to a reset power supply, and is fixed to a reset potential Vrst which is a constant potential. The reset switch RST is switched to a conductive state (on) or a non-conductive state (off) according to a control signal RG applied through the fourth scanning line Sgd. By switching the reset switch RST to the on state, it is possible to reset the potential of the source electrode of the drive transistor DRT to the reset potential Vrst.

The storage capacitance Cs is connected between the gate electrode and the source electrode of the drive transistor DRT. The auxiliary capacitance Cad is connected between the source electrode of the drive transistor DRT and the high-potential power supply line SLa which is a wiring line having a constant potential.

On the other hand, the panel driver 5 shown in FIG. 2 controls the scanning line driving circuits YDR1 and YDR2 and the signal line driving circuit XDR. The panel driver 5 receives a digital image signal and a synchronization signal supplied from the outside, and generate a vertical scanning control signal for controlling a vertical scanning timing and a horizontal scanning control signal for controlling a horizontal scanning timing based on the synchronization signal. Then, the panel driver 5 supplies the vertical scanning control signal and the horizontal scanning control signal to the scanning line driving circuits YDR1 and YDR2 and the signal line driving circuit XDR, and supplies the digital image signal and an initialization signal to the signal line driving circuit XDR in synchronization with the horizontal and vertical scanning timings.

The signal line driving circuit XDR converts the image signal sequentially obtained in each horizontal scanning period under the control of the horizontal scanning control signal into an analog format, and supplies the image signal Vsig corresponding to a grayscale to the image signal lines VL. The panel driver 5 fixes the high-potential power supply line SLa to the high potential Pvdd, fixes the reset line Sgr to the reset potential Vrst, and fixes the initialization line Sgi to the initialization potential Vini. The potential of the high-potential power supply line SLa, the potential of the reset line Sgr, and the potential of the initialization line Sgi may be set via the signal line driving circuit XDR.

The scanning line driving circuits YDR1 and YDR2 receive a start pulse signal STV, a clock signal CKV and the like from the panel driver 5.

The scanning line driving circuits YDR1 and YDR2 include a shift register, an output buffer and the like which are not shown in the drawing, and transfers the start pulse signal STV sequentially to the shift resistor of the next stage, and supplies four types of control signal, that is, control signals IG, BG, SG and RG to the subpixels SP of each row via the output buffer. Accordingly, the first scanning line Sga, the second scanning line Sgb, the third scanning line Sgc and the fourth scanning line Sgd are driven by the control signals IG, BG, SG and RG, respectively.

Figure 4:
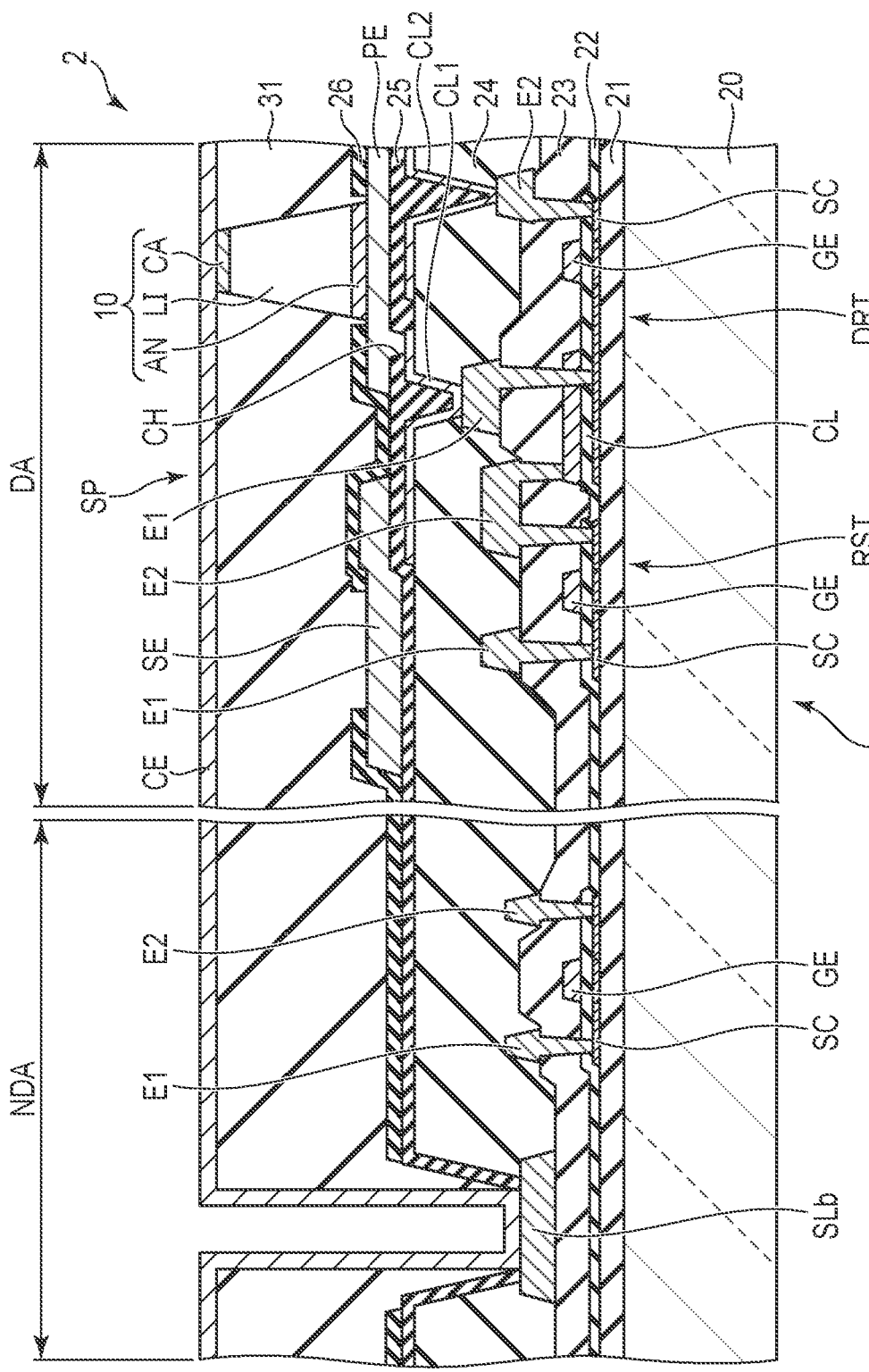
FIG. 4 is a fragmentary cross-sectional view showing a display panel shown in FIG. 1.

Next, the drive transistor DRT, the reset switch RST, a pixel electrode PE, a mounting electrode SE, the light-emitting element 10, the low potential power supply line SLb, the common electrode CE and the like will be described with reference to FIG. 4. FIG. 4 is a fragmentary cross-sectional view showing the display panel 2 shown in FIG. 1. In FIG. 4, the display panel 2 is drawn such that the display surface, that is, the light emission surface faces upward and the rear surface faces downward.

As shown in FIG. 4, the display panel 2 comprises an insulating substrate 20, insulating layers 21, 22, 23, 24, 25 and 26 disposed on the insulating substrate 20, and the pixels PX. The pixels PX are disposed on the insulating substrate 20, are located in the display area DA, and include the subpixels SP of a plurality of colors.

As the insulating substrate 20, a glass substrate of quartz, alkali-free glass or the like or a resin substrate of polyimide or the like can be mainly used. The material of the insulating substrate 20 may be any material which can withstand a processing temperature when the TFTs are manufactured. The insulating substrate 20 is a resin substrate having flexibility, the display device 1 can be composed as a sheet display. The resin substrate is not limited to polyimide, but other resin materials may be used. It should be noted that it may be more appropriate to refer to the insulating substrate 20 as an organic insulating layer or a resin layer when polyimide or the like is used for the insulating substrate 20.

The insulating layer 21 is disposed on the insulating substrate 20. The respective TFTs are formed on the insulating layer 21. The drive transistor DRT, the reset switch RST and the like are formed on the insulating layer 21 in the display area DA, and a TFT constituting the scanning line driving circuit YDR and the like are formed on the insulating layer 21 in the non-display area NDA. The TFTs of the drive transistor DRT and the like each comprise a semiconductor layer SC, a gate electrode GE, a first electrode E1 and a second electrode E2.

The semiconductor layer SC is disposed on the insulating layer 21. The insulating layer 22 is disposed on the insulating layer 21 and the semiconductor layer SC. The gate electrode GE is disposed on the insulating layer 22, and is opposed to the channel region of the semiconductor layer SC. The insulating layer 23 is disposed on the insulating layer 22 and the gate electrode GE. The first electrode E1 and the second electrode E2 are disposed on the insulating layer 23. The first electrode E1 and the second electrode E2 are electrically connected to the corresponding semiconductor layer SC through contact holes formed in the insulating layer 22 and the insulating layer 23, respectively.

In the present embodiment, a conductive layer CL is formed on the insulating layer 22. The first electrode E1 of the drive transistor DRT is electrically connected not only to the corresponding semiconductor layer SC but also to the conductive layer CL. The second electrode E2 of the reset switch RST is electrically connected not only to the corresponding semiconductor layer SC but also to the conductive layer CL. Therefore, the drive transistor DRT and the reset switch RST are electrically connected to each other via the conductive layer CL.

In the non-display area NDA, the low-potential power supply line SLb is disposed on the insulating layer 23. The insulating layer 24 is disposed on the insulating layer 23, the first electrode E1, the second electrode E2 and the low-potential power supply line SLb. The insulating layer 24 functions as the first insulating layer.

The first conductive layer CL1 and the second conductive layer CL2 as a conductive layer are disposed on the insulating layer 24. The first conductive layer CL1 is electrically connected to the first electrode E1 through a contact hole formed in the insulating layer 24. The second conductive layer CL2 is electrically connected to the second electrode E2 through a contact hole formed in the insulating layer 24.

The insulating layer 25 is disposed on the insulating layer 24, the first conductive layer CL1 and the second conductive layer CL2. The insulating layer 25 functions as the second insulating layer. The thickness of the insulating layer 25 is about 100 to 200 nm. The pixel electrode PE and the mounting electrode SE are disposed on the insulating layer 25. The pixel electrode PE is electrically connected to the first conductive layer CL1 through a contact hole CH formed in the insulating layer 25. The mounting electrode SE is overlaid on the first conductive layer CL1. A region of the mounting electrode SE which is opposed to each conductive layer CL1 (the conductive layer of each subpixel) is raised. For example, the mounting electrode SE is raised about 50 to 100 nm. The mounting electrode SE is in an electrically floating state.

Here, the insulating layers 21, 22, 23, 24, 25 and 26 are formed of an inorganic insulating material or an organic insulating material. In the present embodiment, the insulating layers 21, 22, 23, 25 and 26 are formed using a material such as silicon oxide ($SiO_2$) or silicon nitride (SiN) as an inorganic insulating material. For example, the insulating layer 25 is formed of SiN. The insulating layer 24 is formed using, for example, photosensitive acrylic as an organic insulating material.

The semiconductor layer SC is formed using low-temperature polycrystalline silicon as polycrystalline silicon. However, the semiconductor layer SC may be formed of semiconductor other than polysilicon such as amorphous silicon or oxide semiconductor.

The gate electrode GE and the conductive layer CL are located in the same layer and are formed using metal as the same conductive material. The gate electrode GE and the conductive layer CL are formed of a metal material such as aluminum (Al), titanium (Ti), silver (Ag), molybdenum (Mo), tungsten (W), copper (Cu) or chromium (Cr), an alloy of these metal materials combined together or the like, and may have a single-layer structure or a multilayer structure. For example, the gate electrode GE and the conductive layer CL are formed of molybdenum-tungsten (MoW).

The first electrode E1, the second electrode E2 and the low-potential power supply line SLb are located in the same layer and are formed using metal as the same conductive material. The first electrode E1, the second electrode E2 and the low-potential power supply line SLb are formed of the above-described metal material, the above-described alloy or the like, and may have a single-layer structure or a multilayer structure. For example, the first electrode E1, the second electrode E2 and the low-potential power supply line SLb are formed of TAT. TAT has a three-layer stuck structure (Ti-based/Al-based/Ti-based), and has a lower layer formed of a metal material containing Ti as a main component such as Ti or an alloy containing Ti, a middle layer composed of a metal material containing Al as a main component such as Al or an alloy containing Al, and an upper layer formed of a metal material containing Ti as a main component such as Ti or an alloy containing Ti.

It should be noted that, although a top-gate TFT is taken as an example here, the TFT may be a bottom gate TFT.

The switches such as the drive transistor DRT and the like are covered with the insulating layer 24.

The first conductive layer CL1 and the second conductive layer CL2 are located in the same layer and are formed using the above-described metal material, the above-described alloy, a transparent conductive material or the like as the same conductive material. The first conductive layer CL1 and the second conductive layer CL2 may have a single-layer structure or a multilayer structure. In the present embodiment, the first conductive layer CL1 and the second conductive layer CL2 are formed of MAM. MAM has a three-layer stack structure (Mo-based/Al-based/Mo-based), and has a lower layer formed of a metal material containing Mo as a main component such as Mo or an alloy containing Mo, a middle layer formed of a metal material containing Al as a main component such as Al or an alloy containing Al, and an upper layer formed of a metal material containing Mo as a main component such as Mo or an alloy containing Mo. Therefore, the first conductive layer CL1 and the second conductive layer CL2 each include a metal layer formed of molybdenum or a molybdenum alloy.

The pixel electrode PE and the mounting electrode SE are located in the same layer and are formed using metal as the same conductive material. The pixel electrode PE and the mounting electrode SE each have a single conductive layer, a three-layer stack structure or a two-layer stack structure. In the present embodiment, the pixel electrode PE and the mounting electrode SE are formed of Al. The pixel electrode PE and the mounting electrode SE may be formed of a transparent conductive material.

It is preferable that the melting point of the first conductive layer CL1 should be higher than the melting point of the mounting electrode SE.

Each pixel PX has the mounting electrode SE. The mounting electrode SE is disposed on the insulating layer 25, and is located spaced apart from the pixel electrode PE. The pixel electrode PE is electrically connected to the first conductive layer CL1, and receives a signal having a controlled current value from the drive transistor DRT via the first conductive layer CL1.

The insulating layer 26 is disposed on the insulating layer 25, the pixel electrode PE and the mounting electrode SE. The insulating layer 26 functions as the third insulating layer. Although not shown in the drawing, the insulating layer 26 is located on the pixel electrodes PE and the mounting electrodes SE, covers the pixel electrodes PE and the mounting electrodes SE, and exposes the light-emitting elements 10. The insulating layer 26 has an opening for exposing a part of the surface of the pixel electrode PE to mount the light-emitting element 10 on the pixel electrode PE, and an opening for exposing a part of the surface of the mounting electrode SE.

The size of the opening of the insulating layer 26 is slightly greater than that of the light-emitting element 10 in consideration of a mounting deviation amount or the like in the mounting process of the light-emitting element 10. For example, when the light-emitting element 10 has a mounting area of substantially 10 μm×10 μm, it is preferable that an area of substantially 20 μm×20 μm should be secured for the opening.

In the display area DA, the light-emitting element 10 is mounted on the pixel electrode PE. The light-emitting element 10 has an anode AN as the first electrode, a cathode CA as the second electrode, and a light-emitting layer LI which emits light. The light-emitting elements 10 having the first, second and third emission colors are prepared, respectively, and the anodes AN thereof are electrically connected and fixed to the corresponding pixel electrodes PE. In the present embodiment, the first color is red (R), the second color is green (G), and the third color is blue (B).

The connection between the anode AN of the light-emitting element 10 and the pixel electrode PE is not limited in particular as long as excellent conduction can be secured between the two and the layer stack structure from the insulating substrate 20 to the insulating layer 26 will not be damaged. For example, a reflow process using a soldering material molten at a low temperature, a method such as placing the light-emitting element 10 on the pixel electrode PE via a conductive paste and then sintering the elements, or a method of solid-state welding such as ultrasonic welding by using the similar materials for the surface of the pixel electrode PE and the anode AN of the light emitting element 10 can be adopted. The light-emitting element 10 has the cathode CA on the opposite side to the anode AN electrically connected to the pixel electrode PE.

After the light-emitting element 10 is mounted, an element insulating layer 31 is disposed on the insulating layer 25, the pixel electrode PE, the mounting electrode SE and the insulating layer 26. The element insulating layer 31 functions as the fourth insulating layer. The element insulating layer 31 fills a space between the light-emitting elements 10 and is formed of a resin material. The element insulating layer 31 exposes the surface of the cathode CA of the light-emitting element 10.

The common electrode CE is located at least in the display area DA, is disposed on the element insulating layer 31 and the light-emitting elements 10, and covers the light-emitting elements 10 of the pixels. The common electrode CE is disposed on the common electrode CE side surfaces of the cathodes CA and the element insulating layer 31, is in contact with the cathodes CA, and is electrically connected to the cathodes CA. The common electrode CE is shared by the subpixels SP.

The common electrode CE extends in the non-display area NDA, and is electrically connected to the low-potential power supply line SLb in the non-display area NDA. The common electrode CE is in contact with the low-potential power supply line SLb through a contact hole formed in the element insulating layer 31, the insulating layer 26, the insulating layer 25 and the insulating layer 24. Therefore, the common electrode CE is held at the same constant potential as the potential of the low-potential power supply line SLb, and electrically connects the low-potential power supply line SLb and the cathodes CA of all the light-emitting elements 10.

The common electrode CE has to be formed as a transparent electrode in order to extract light emitted from the light-emitting element 10, and is formed using, for example, ITO as the transparent conductive material. On the other hand, if the sidewall of the light-emitting element 10 is insulated by a protective film or the like, the space does not have to be filled with the resin material or the like, but the resin material only has to insulate at least the anode AN, the surface of the pixel electrode PE exposed from the anode AN and the surface of the mounting electrode SE from each other. In this case, the element insulating layer 31 is formed with a thickness not reaching the cathode CA of the light-emitting element 10, and then the common electrode CE is formed. Although a part of the unevenness due to the mounting of the light-emitting element 10 remains on the surface on which the common electrode CE is formed, the material for the common electrode CE only has to cover the surface continuously without being disconnected by steps.

As described above, the display panel 2 has the structure from the insulating substrate 20 to the common electrode CE. The display device 1 using the light-emitting element 10 of the present embodiment as the display element is configured, for example, as described above. A cover member such as a cover glass, a touch panel substrate and the like may be disposed on the common electrode CE as needed.

Figure 5:
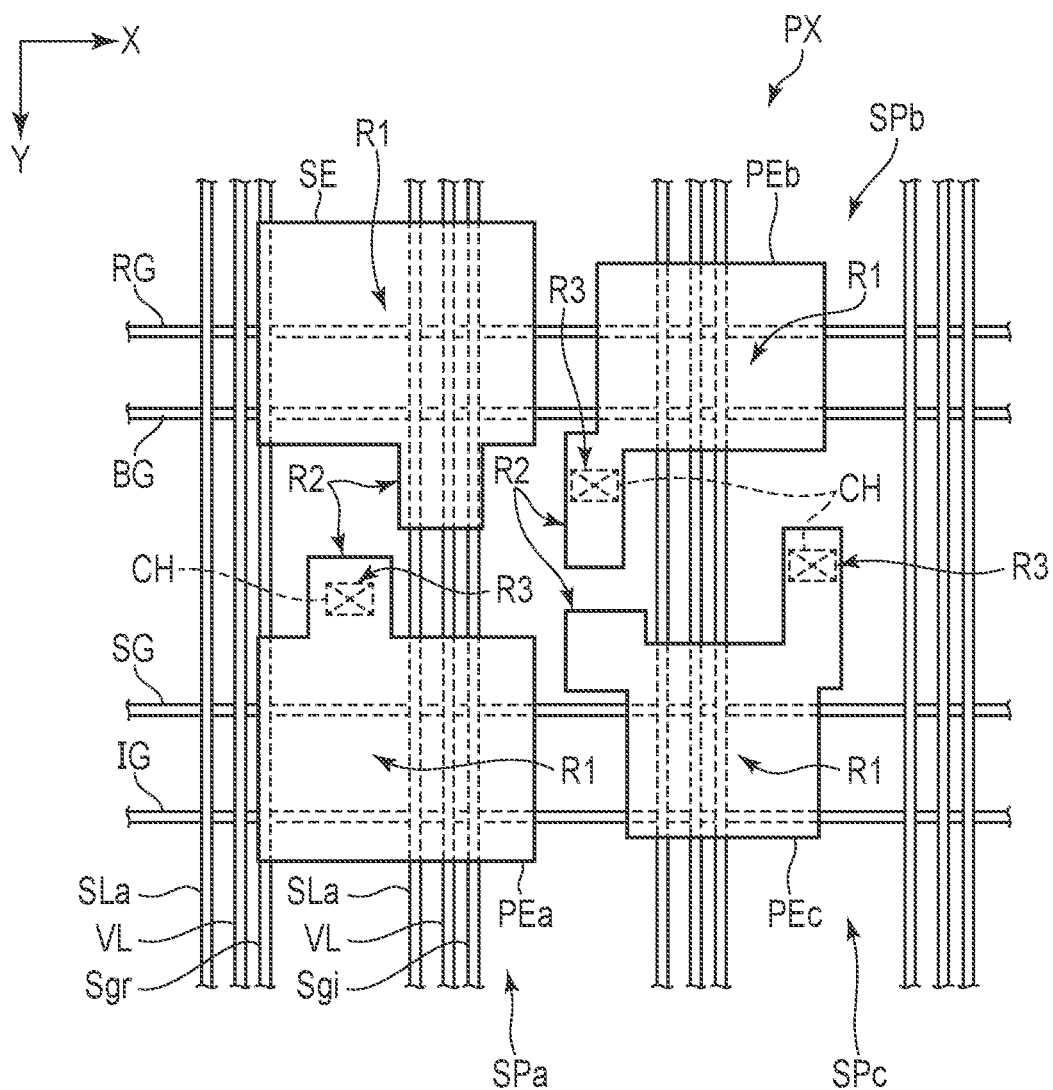
FIG. 5 is a plan view showing a layout of a pixel shown in FIG. 1, and is an illustration showing respective wiring lines, pixel electrodes and a mounting electrode.

Next, the layout of the pixel PX will be described. FIG. 5 is a plan view showing the layout of the pixel PX shown in FIG. 1, and is an illustration showing the respective wiring lines, the pixel electrode PE and the mounting electrode SE.

As shown in FIG. 5, each pixel PX has a plurality of subpixels SP. In the present embodiment, each pixel PX has subpixels SP of three colors which are a subpixel SPa of the first color, a subpixel SPb of the second color, and a subpixel SPc of the third color. The subpixel SPa has a pixel electrode PEa, the subpixel SPb has a pixel electrode PEb, and the subpixel SPc has a pixel electrode PEc.

The pixel electrode PEa is adjacent to the mounting electrode SE in the second direction Y. The pixel electrode PEb is adjacent to the mounting electrode SE in the first direction X. The pixel electrode PEc is adjacent to the pixel electrode PEa in the first direction X, and is adjacent to the pixel electrode PEb in the second direction Y. In planar view, the size of the pixel electrode PEa is greater than the size of the pixel electrode PEb and the size of the pixel electrode PEc. The size of the mounting electrode SE is substantially the same as the size of the pixel electrode PEa, and is greater than each of the size of the pixel electrode PEb and the size of the pixel electrode PEc.

The mounting electrode SE has a first region R1 for mounting the light-emitting element 10, and a second region R2 for connecting the mounting electrode SE and the first conductive layer CL1 during repair which will be described later. In the second region R2, the mounting electrode SE is overlaid on three first conductive layers CL1 of the same pixel PX. The pixel electrode PE has a first region R1, and a third region R3 for electrically connecting itself to the first conductive layer CL1.

Figure 6:
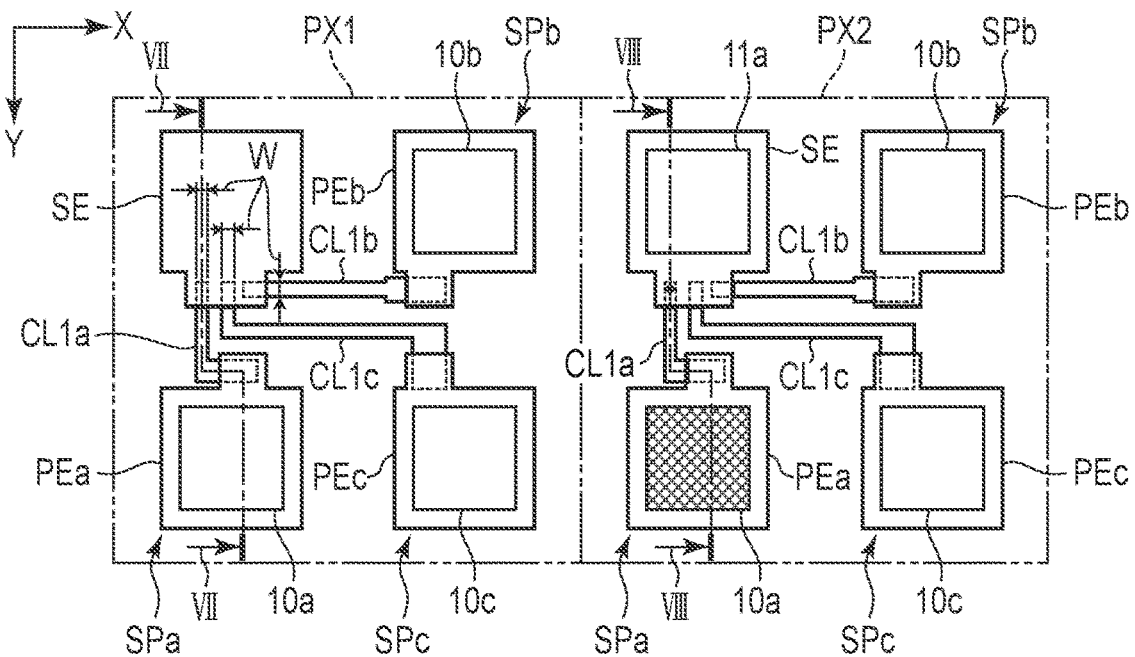
FIG. 6 is a plan view showing a first pixel and a second pixel of the embodiment, and is an illustration showing the pixel electrodes, the mounting electrodes, light-emitting elements and first conductive layers.
Figure 7:
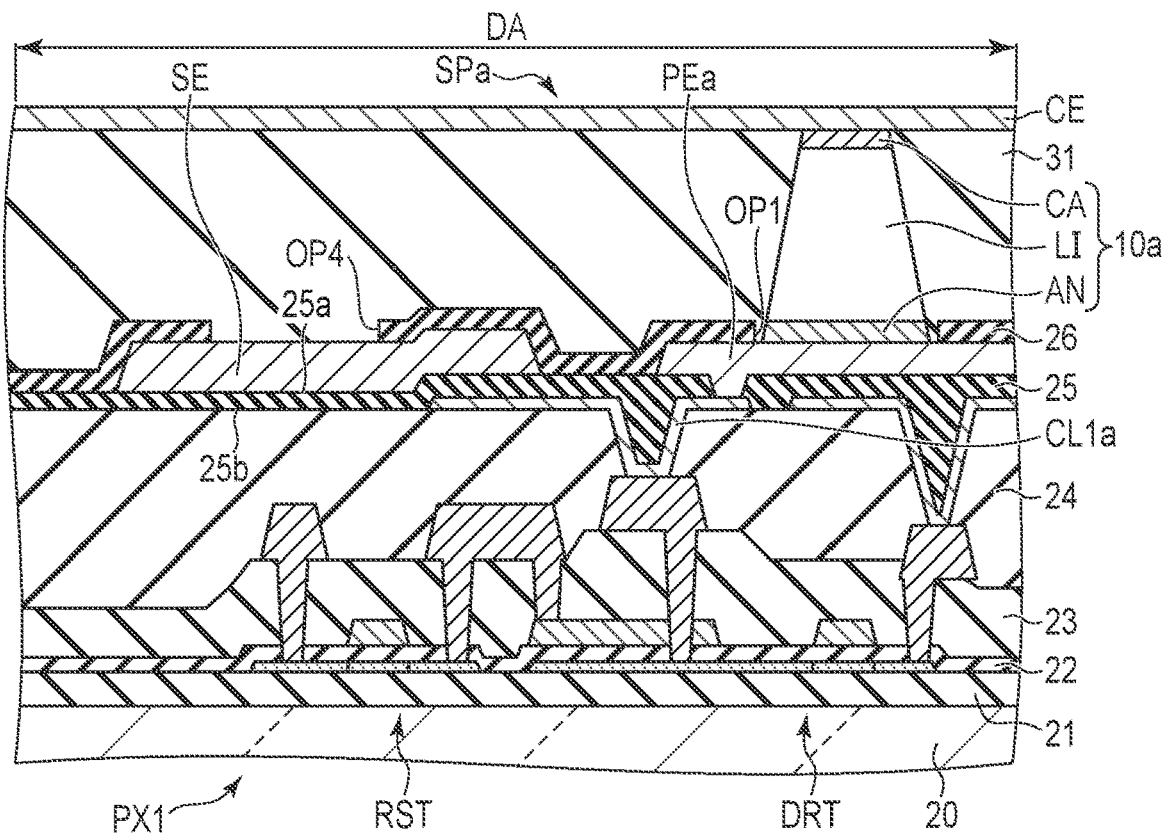
FIG. 7 is a cross-sectional view showing the display panel along line VII-VII of FIG. 6, and is an illustration showing the first pixel.
Figure 8:
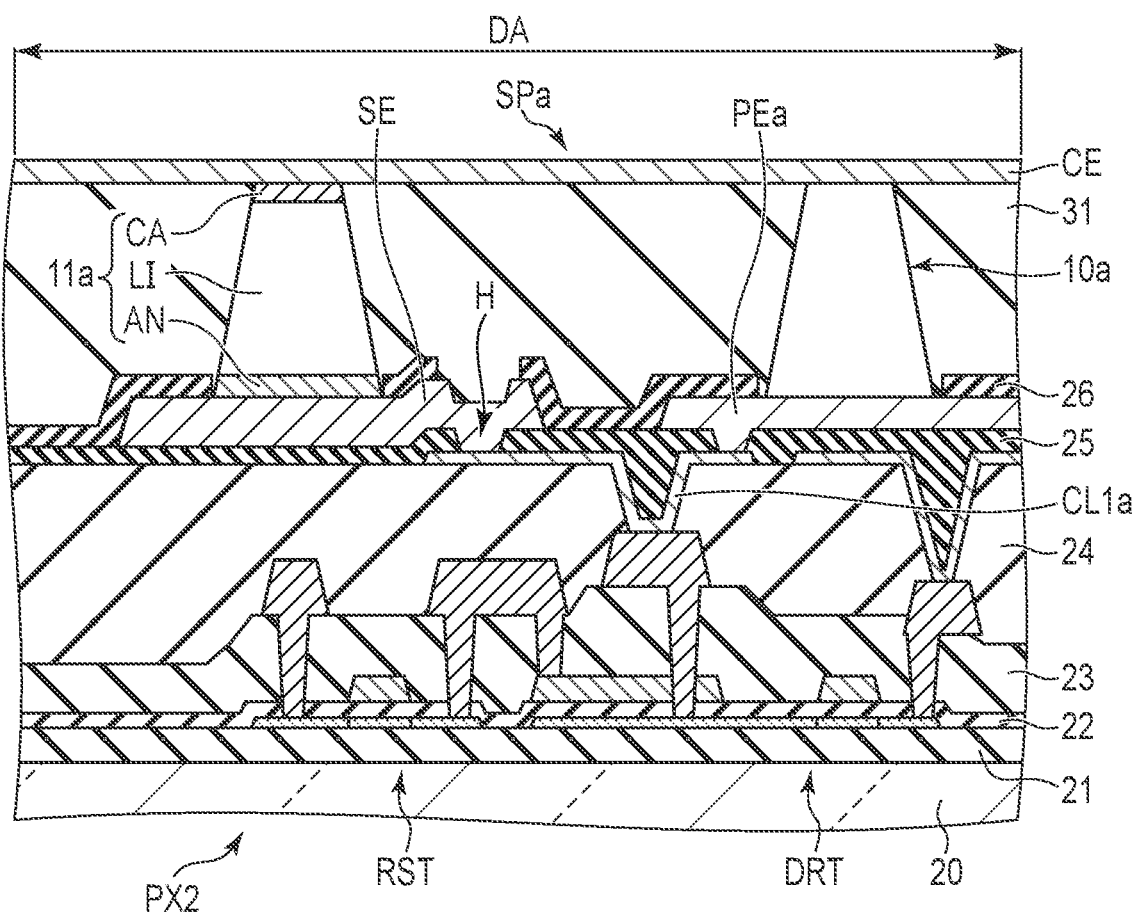
FIG. 8 is a cross-sectional view showing the display panel along line VIII-VIII of FIG. 6, and is an illustration showing the second pixel.

Next, a first pixel PX1 and a second pixel PX2 of the pixels PX of the display panel 2 will be described. FIG. 6 is a plan view showing the first pixel PX1 and the second pixel PX2 of the present embodiment, and is an illustration showing the pixel electrode PE, the mounting electrode SE, the light-emitting element 10 and the first conductive layer CL1. FIG. 7 is a cross-sectional view showing the display panel 2 along line VII-VII of FIG. 6, and is an illustration showing the first pixel PX1. FIG. 8 is a cross-sectional view showing the display panel 2 along line VIII-VIII of FIG. 6, and is an illustration showing the second pixel PX2.

As shown in FIG. 6, the pixels PX of the display panel 2 include the first pixel PX1, the second pixel PX2 and the like.

As shown in FIGS. 6 and 7, in the first pixel PX1, a light-emitting element 10a of the first color is mounted on the pixel electrode PEa, a light-emitting element 10b of the second color is mounted on the pixel electrode PEb, and a light-emitting element 10c of the third color is mounted on the pixel electrode PEc. The light-emitting elements 10 of the first pixel PX1 are all normal light-emitting elements. Therefore, in the first pixel PX1, the mounting electrode SE is not electrically connected to a first conductive layer CL1a of the subpixel SPa, a first conductive layer CL1b of the subpixel SPb, and a first conductive layer CL1c of the subpixel SPc. The mounting electrode SE is in an electrically floating state. The pixel electrode PEa is connected to the first conductive layer CL1a, the pixel electrode PEb is connected to the first conductive layer CL1b, and the pixel electrode PEc is connected to the first conductive layer CL1c. The first conductive layer CL1a, the first conductive layer CL1b and the first conductive layer CL1c may be referred to also as the first wiring line, the second wiring line and the third wiring line, respectively. No additional light-emitting element is mounted on the mounting electrode SE. A width W of the first conductive layer CL1c is approximately 2 μm.

The insulating layer 25 has a first surface 25a which is in contact with the pixel electrode PEa and the mounting electrode SE, and a second surface 25b which is opposed to the first surface 25a and is in contact with the first conductive layer CL1a. Although not shown in the drawing, the first surface 25a is also in contact with the pixel electrode PEb and the pixel electrode PEc. Although not shown in the drawing, the second surface 25b is also in contact with the first conductive layer CL1b and the first conductive layer CL1c.

The first conductive layer CL1a, the first conductive layer CL1b and the first conductive layer CL1c are drawn toward the mounting electrode SE. The tip of the first conductive layer CL1a, the tip of the first conductive layer CL1b and the tip of the first conductive layer CL1c which extend toward the mounting electrode SE overlap the mounting electrode SE. The mounting electrode SE of the first pixel PX1 is insulated from each of the first conductive layer CL1a, the first conductive layer CL1b and the first conductive layer CL1c by the insulating layer 25.

The insulating layer 26 has a first opening OP1 exposing the pixel electrode PEa and a fourth opening OP4 exposing the mounting electrode SE in the first pixel PX1. The light-emitting element 10a is connected to the pixel electrode PEa through the first opening OP1.

Although not shown in the drawing, the insulating layer 26 further has a second opening exposing the pixel electrode PEb and a third opening exposing the pixel electrode PEc in the first pixel PX1. The light-emitting element 10b is connected to the pixel electrode PEb through the second opening. The light-emitting element 10c is connected to the pixel electrode PEc via the third opening.

The first surface 25a of the insulating layer 25 is in contact with the insulating layer 26 at a position away from each of the pixel electrode PEa, the pixel electrode PEb, the pixel electrode PEc and the mounting electrode SE.

As shown in FIGS. 6 and 8, in the second pixel PX2 on the other hand, the light-emitting element 10a of the first color is mounted on the pixel electrode PEa, the light-emitting element 10b of the second color is mounted on the pixel electrode PEb, and the light-emitting element 10c of the third color is mounted on the pixel electrode PEc. In the second pixel PX2, the light-emitting elements 10b and 10c are normal light-emitting elements, but the light-emitting element 10a of the first color is not a normal light-emitting element. In the second pixel PX2, no current flows between the pixel electrode PEa and the common electrode CE via the light-emitting element 10a. The light-emitting element 10a of the second pixel PX2 may be damaged, and the cathode CA may not be present in the light-emitting element 10a.

Therefore, the second pixel PX2 further has an additional light-emitting element 11a of the first color as the light-emitting element of the same color as the light-emitting element 10a which does not light up. By disposing the additional light-emitting element 11a in the second pixel PX2, it is possible to avoid a situation where the first color is insufficient as the emission color in the second pixel PX2.

The additional light-emitting element 11a is a micro-LED. The additional light-emitting element 11a has the anode AN as the first electrode, the cathode CA as the second electrode, and the light-emitting layer LI which emits light. The additional light-emitting element 11a is mounted on the mounting electrode SE of the second pixel PX2, and the anode AN of the additional light-emitting element 11a is electrically connected to the mounting electrode SE.

In the second pixel PX2, the mounting electrode SE is in contact with the conductive layer CL1a of the subpixel SPa of the first color through an opening H of the insulating layer 25. In the second pixel PX2, the mounting electrode SE is electrically insulated from the first conductive layer CL1b, and is electrically insulated from the first conductive layer CL1c. The mounting electrode SE is electrically connected to the drive transistor DRT of the subpixel SPa of the first color, and receives the signal having the controlled current value from the drive transistor DRT. In the second pixel PX2, when the signal having the controlled current value is applied from the drive transistor DRT of the subpixel SPa of the first color to the pixel electrode PEa of the subpixel SPa of the first color and the mounting electrode SE, the light-emitting element 10a does not emit light but the additional light-emitting element 11a emits light.

In the present embodiment, in order to electrically connect the mounting electrode SE to the drive transistor DRT of the subpixel SPa, the mounting electrode SE is short-circuited to the first conductive layer CL1a in the second pixel PX2.

When the additional light-emitting element 11a of the second pixel PX2 is considered as described above, the element insulating layer 31 further exposes the additional light-emitting element 11a. The common electrode CE is further disposed on the additional light-emitting element 11a. The cathode CA of the additional light-emitting element 11a is further electrically connected to the common electrode CE.

If the pixels PX includes a pixel PX having a light-emitting element 10 which does not light up in addition to the second pixel PX2, the pixel PX may be configured similarly to the second pixel PX2. In other words, an addition light-emitting element 11 of the first color, the second color or the third color may be added to the pixel PX having the light-emitting element 10 which does not light up, and the mounting electrode SE may be connected to the first conductive layer CL1 of the subpixel SP having the light-emitting element 10 which does not light up.

The display device 1 of the present embodiment is configured as described above.

When the light-emitting element 10 is a micro-light-emitting diode, the light-emitting element 10a, the light-emitting element 10b and the light-emitting element 10c may be referred to also as the first color micro-light-emitting diode, the second color micro-light-emitting diode and the third color micro-light-emitting diode, respectively. In addition, the pixel electrode PEa, the pixel electrode PEb, the pixel electrode PEc and the mounting electrode SE may be referred to also as the first electrode, the second electrode, the third electrode and the fourth electrode, respectively.

Figure 9:
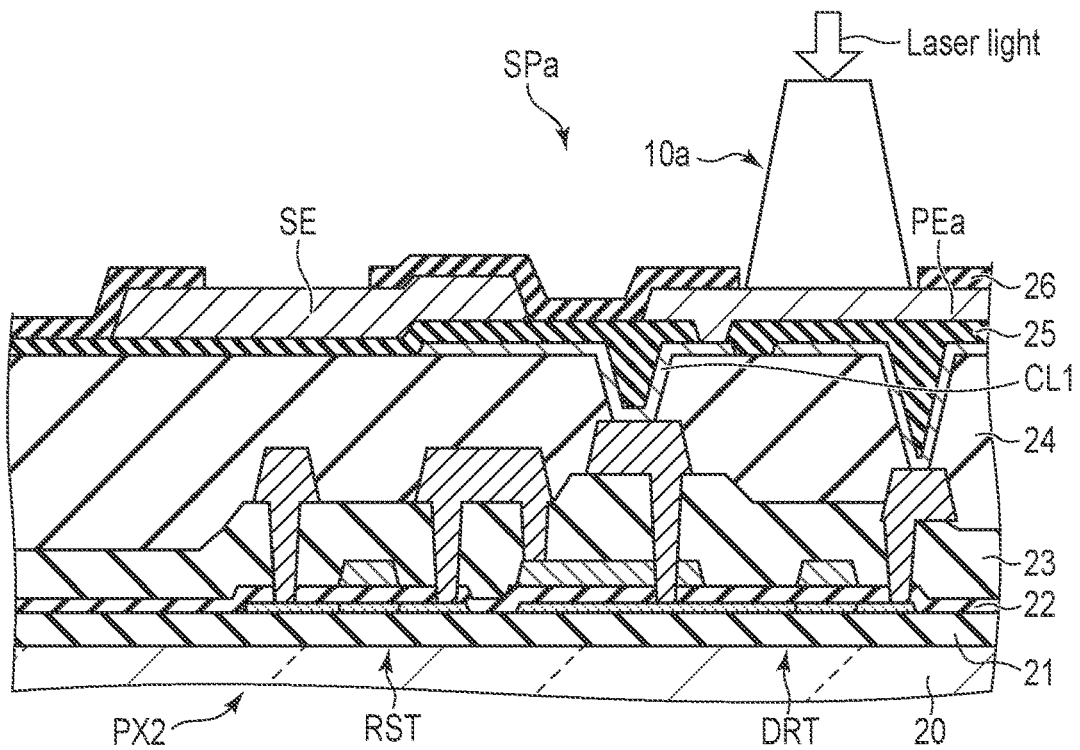
FIG. 9 is an illustration for explaining a manufacturing method of the display device according to the embodiment, and is an illustration showing a state where laser light is radiated to the light-emitting element.
Figure 10:
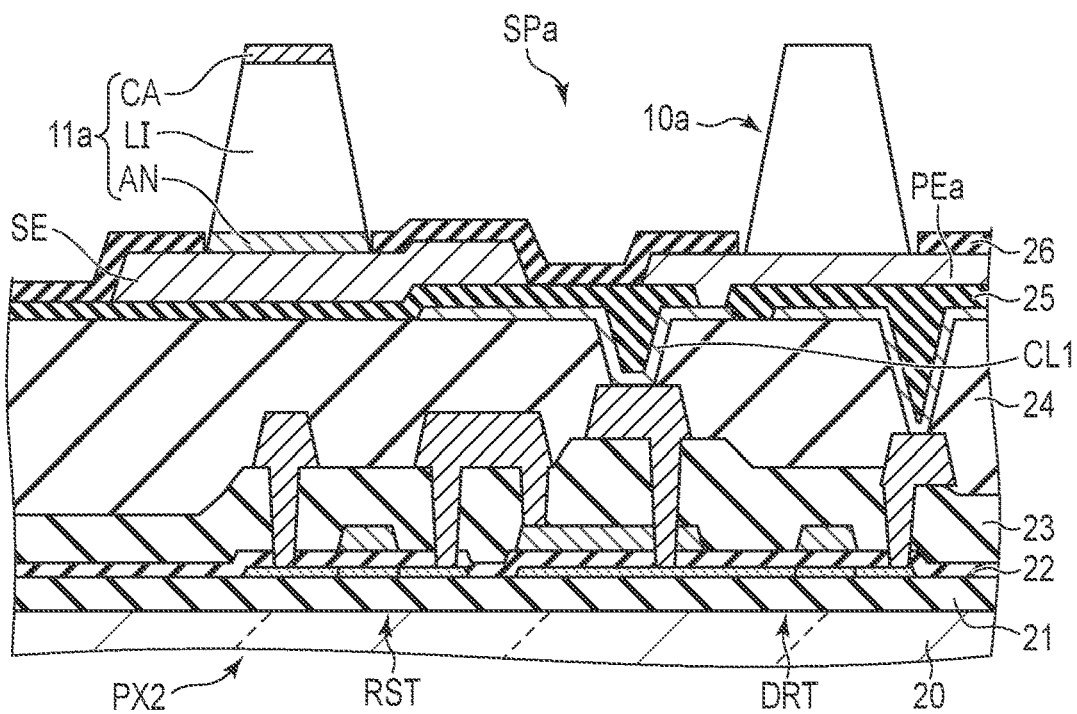
FIG. 10 is an illustration for explaining the manufacturing method following FIG. 9, and is an illustration showing a state where an additional light-emitting element is mounted on the mounting electrode.
Figure 11:
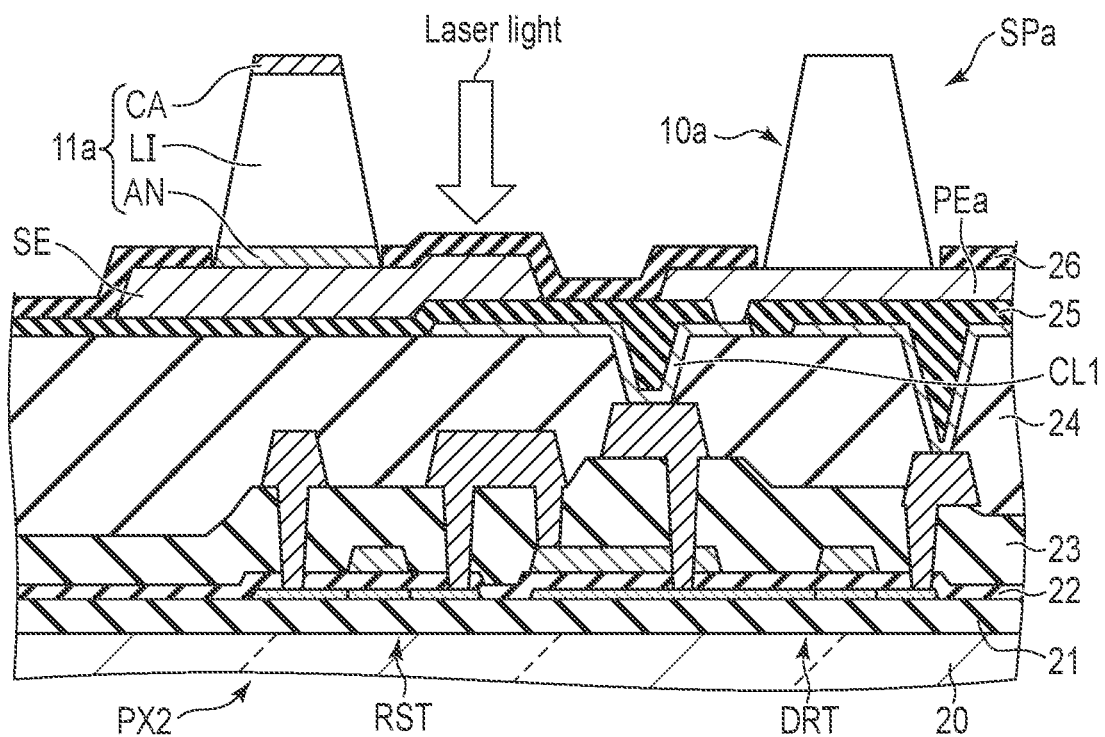
FIG. 11 is an illustration for explaining the manufacturing method following FIG. 10, and is an illustration showing a state where laser light is radiated to the mounting electrode.

Next, the manufacturing method of the display device 1 will be described. Here, the manufacturing method of the display panel 2 of the manufacturing method of the display device 1 will be described. FIG. 9 is an illustration for explaining the manufacturing method of the display device 1 according to the present embodiment, and is an illustration showing a state where laser light is radiated to the light-emitting element 10a. FIG. 10 is an illustration for explaining the manufacturing method following FIG. 9, and is an illustration showing a state where the additional light-emitting element 11a is mounted on the mounting electrode SE. FIG. 11 is an illustration for explaining the manufacturing method following FIG. 10, and is an illustration showing a state where laser light is radiated to the mounting electrode SE.

As shown in FIG. 9, when the manufacturing method of the display panel 2 starts, a panel PNL having a layer stack structure from the insulating substrate 20 to the insulating layer 26 is prepared first. The panel PNL is a structure which becomes the base of the display panel 2. The panel PNL comprises the insulating substrate 20, the insulating layer 25, the pixels PX including subpixels SP of a plurality of colors, the insulating layer 26 and the like. Each subpixel SP has the drive transistor DRT, the first conductive layer CL1, the pixel electrode PE and the light-emitting element 10. At this moment, the mounting electrodes SE of all the pixels PX are in an electrically floating state. The panel PNL does not have the additional light-emitting element 11, the element insulating layer 31 and the common electrode CE.

After the panel PNL is prepared as described above, whether the light-emitting elements 10 are defective in light emission or not is inspected. During inspection, each light-emitting element 10 is electrically inspected by applying a probe to the cathode CA of the light-emitting element 10 or the like. Whether the light-emitting element 10 is defective in light emission or not can be determined, for example, visually, but can also be determined mechanically using a sensor. The light emission defect of the light-emitting element 10 includes not only a case where the light-emitting element 10 does not light up at all but also a case where the luminance level of the light emitted from the light-emitting element 10 is less than a threshold value. The description hereinafter focuses on the first pixel PX1 and the second pixel PX2 of the pixels PX.

If it is determined that the light-emitting elements 10 of the first pixel PX1 of the pixels PX are not defective in light emission, the mounting electrode SE of the first pixel PX1 is maintained in an electrically floating state (FIG. 6).

On the other hand, if the light-emitting element 10a of the second pixel PX2 of the pixels PX is defective in light emission, laser light is radiated to the light-emitting element 10a of the second pixel PX2 to damage the light-emitting element 10a and break the light-emitting element 10a. At this time, the cathode CA of the light-emitting element 10a may be lost. It is preferable that no current should flow between the pixel electrode PEa and the common electrode CE via the light-emitting element 10a which is defective in light-emission. Accordingly, the reduction of the current amount flowing in the additional light-emitting element 11a can be suppressed.

Then, as shown in FIG. 10, the additional light-emitting element 11a of the first color is mounted on the mounting electrode SE of the second pixel PX2, and the anode AN of the additional light-emitting element 11a is electrically connected to the mounting electrode SE.

Then, as shown in FIG. 11, laser light is radiated to a region of the mounting electrode SE on which the first conductive layer CL1a of the subpixel SPa is overlaid in the second pixel PX2. As described above, the position to be irradiated with laser light can be determined based on the pattern of bumps of the mounting electrode SE. Accordingly, the mounting electrode SE can be short-circuited to the first conductive layer CL1a of the subpixel SPa. Therefore, the mounting electrode SE can be electrically connected to the drive transistor DRT of the subpixel SPa.

It should be noted that, unlike the order of manufacturing processes of the present embodiment, laser light may be radiated to the mounting electrode SE and the mounting electrode SE may be short-circuited to the first conductive layer CL1, and then the additional light-emitting element 11a may be mounted. In that case, the laser light radiation to the light-emitting element 10a and the laser light radiation to the mounting electrode SE can be performed consecutively. For example, since laser light can be radiated using the same laser, it is possible to contribute to the reduction of the manufacturing period.

Then, as shown in FIG. 8, the element insulating layer 31 is formed on the insulating layer 26, the light-emitting elements 10 and the additional light-emitting element 11. The element insulating layer 31 exposes the light-emitting elements 10 and the additional light-emitting element 11. Then, the common electrode CE is formed on the element insulating layer 31, the light-emitting elements 10 and the additional light-emitting element 11. Accordingly, the common electrode CE is electrically connected to the cathodes CA of the light-emitting elements 10 and the additional light-emitting element 11a, and are shared by the subpixels SP of the pixels PX. Accordingly, the manufacturing method of the display panel 2 ends.

According to the display device 1 of one embodiment configured as described above and the manufacturing method of the display device 1, each pixel PX comprises a single mounting electrode SE. Therefore, it is possible to contribute to higher definition of the pixel PX than when each subpixel SP comprises a single mounting electrode SE. The light-emitting element 10 which is defective in light emission can be removed from the display panel 2 but may be left on the pixel electrode PE. Accordingly, it is possible to save the trouble of removing the light-emitting element 10 which is defective in light emission from the display panel 2.

From the above, it is possible to obtain the display device 1 which allows easy repair and the manufacturing method of the display device 1.

Modification Example of One Embodiment

Figure 12:
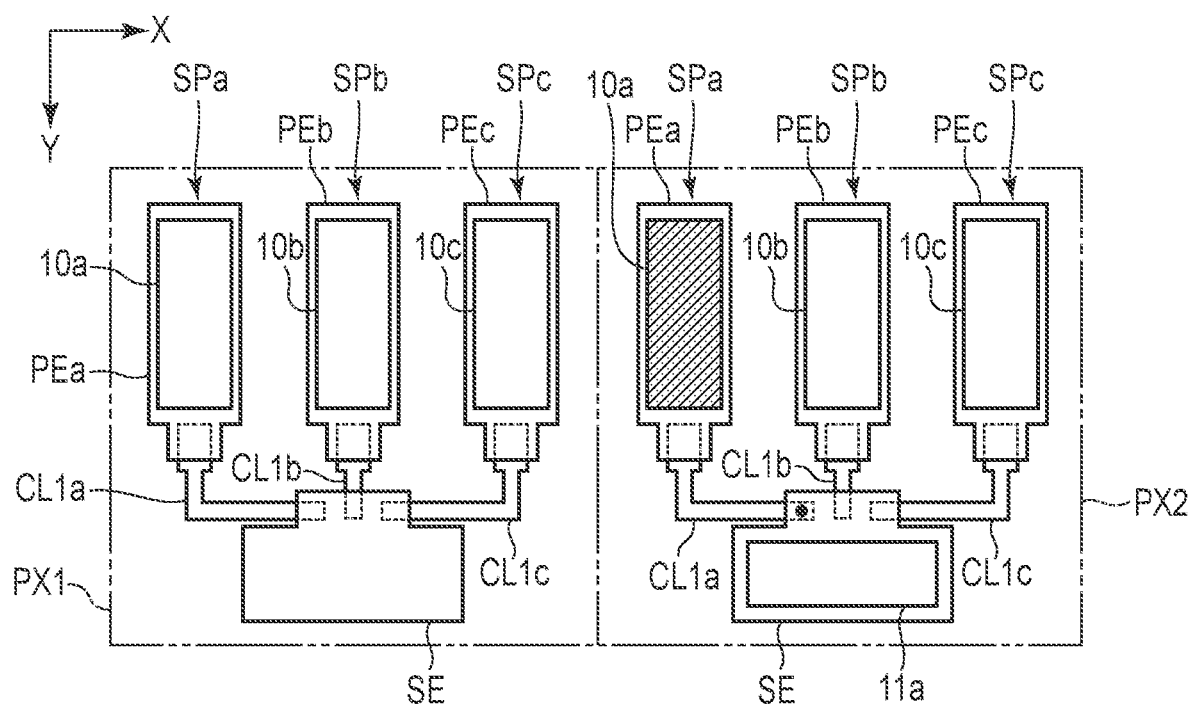
FIG. 12 is a plan view showing the first pixel and the second pixel of the display device according to a modification example of the embodiment, and is an illustration showing the pixel electrodes, the mounting electrodes, the light-emitting elements and the first conductive layers.

Next, a modification example of the above-described embodiment will be described. FIG. 12 is a plan view showing the first pixel PX1 and the second pixel PX2 of the display device 1 according to a modification example of the above-described embodiment, and is an illustration showing the pixel electrodes PE, the mounting electrodes SE, the light-emitting elements 10, the additional light-emitting element 11a and the first conductive layers CL1.

As shown in FIG. 12, the pixel electrodes PEa, PEb and PEc (the light-emitting elements 10a, 10b and 10c) of each pixel PX may be arranged in the first direction X, extend in the second direction Y, and be disposed in stripes (vertical stripes). In each pixel PX, the mounting electrode SE is adjacent in the second direction Y to the group of the pixel electrodes PEa, PEb and PEc, and extends in the first direction X. The mounting electrode SE is opposed to at least one electrode of the pixel electrodes PEa, PEb and PEc in the second direction Y.

The positional relationship between the pixel electrodes PEa, PEb and PEc and the mounting electrode SE is not limited to the positional relationship of this modification example but may be variously modified. As long as any one pixel electrode PE of the pixel electrodes PEa, PEb and PEc can be connected to the mounting electrode SE with the first conductive layer CL1, the above-described positional relationship is not limited in particular.

Also in the display device 1 of the modification example configured as described above and the manufacturing method of the display device 1, the same effects as those obtained in the above-described embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display panel comprising:
   a substrate;
   a first insulating layer disposed on the substrate;
   a second insulating layer disposed on the first insulating layer; and
   a plurality of pixels disposed on the substrate, located in a display area, and each including subpixels of a plurality of colors,
   wherein
   each of the subpixels has:
   a drive transistor covered with the first insulating layer;
   a conductive layer disposed on the first insulating layer, and electrically connected to the drive transistor;
   a pixel electrode disposed on the second insulating layer, electrically connected to the conductive layer, and receiving a signal having a controlled current value from the drive transistor via the conductive layer; and
   a light-emitting element mounted on the pixel electrode, and including a first electrode electrically connected to the pixel electrode,
   each of the pixels has a mounting electrode disposed on the second insulating layer, located spaced apart from the pixel electrode, and overlaid on the conductive layer in each of the subpixels, and
   the mounting electrode is in an electrically floating state in a first pixel of the pixels.

2. The display panel of claim 1, wherein
   a second pixel of the pixels further has an additional light-emitting element of a first color mounted on the mounting electrode, and including a first electrode electrically connected to the mounting electrode, and
   in the second pixel,
   the mounting electrode is in contact with the conductive layer in the subpixel of the first color through an opening of the second insulating layer, and receives the signal having the controlled current value from the drive transistor, and
   when the signal having the controlled current value is supplied from the drive transistor in the subpixel of the first color to the pixel electrode in the subpixel of the first color and the mounting electrode, the light-emitting element of the first color in the subpixel of the first color does not emit light, but the additional light-emitting element of the first color emits light.

3. The display panel of claim 2, wherein in the second pixel, the mounting electrode is electrically insulated from the conductive layer in the subpixel of a second color, and is electrically insulated from the conductive layer in the subpixel of a third color.

4. The display panel of claim 1, wherein a melting point of the conductive layer is higher than a melting point of the mounting electrode.

5. The display panel of claim 4, wherein
   the conductive layer includes a metal layer formed of molybdenum or a molybdenum alloy, and
   the mounting electrode and the pixel electrode are formed of aluminum.

6. The display panel of claim 1, wherein a region of the mounting electrode which is opposed to each of the conductive layers is raised.

7. The display panel of claim 2, wherein each of the light-emitting elements and the additional light-emitting element is a micro-light-emitting diode.

\* \* \* \* \*